United States Patent
Mao et al.

(10) Patent No.: US 10,187,050 B2
(45) Date of Patent: Jan. 22, 2019

(54) METHOD AND APPARATUS FOR BALANCING CURRENT AND POWER

(71) Applicants: TOYOTA MOTOR ENGINEERING & MANUFACTURING NORTH AMERICA, INC., Erlanger, KY (US); VIRGINIA TECH INTELLECTUAL PROPERTIES, INC., Blacksburg, VA (US)

(72) Inventors: Yincan Mao, Blacksburg, VA (US); Chi-Ming Wang, Ann Arbor, MI (US); Khai Ngo, Blacksburg, VA (US)

(73) Assignees: Toyota Motor Engineering & Manufacturing North America, Inc., Erlanger, KY (US); Virginia Tech Intellectual Properties, Inc., Blacksburg, VA (US)

( * ) Notice: Subject to any disclaimer, the term of this patent is extended or adjusted under 35 U.S.C. 154(b) by 1 day.

(21) Appl. No.: 15/485,556

(22) Filed: Apr. 12, 2017

(65) Prior Publication Data
US 2018/0302081 A1 Oct. 18, 2018

(51) Int. Cl.
*H03K 17/14* (2006.01)
*H02M 7/23* (2006.01)
(Continued)

(52) U.S. Cl.
CPC ....... *H03K 17/145* (2013.01); *H01L 29/1608* (2013.01); *H02M 7/23* (2013.01); *H02M 7/537* (2013.01)

(58) Field of Classification Search
CPC ... H03K 17/145; H01L 29/1608; H02M 7/23; H02M 7/537
(Continued)

(56) References Cited

U.S. PATENT DOCUMENTS

| | | | | |
|---|---|---|---|---|
| 5,909,108 A | * | 6/1999 | He | H02M 3/1584 323/222 |
| 7,151,361 B2 | * | 12/2006 | Xi | H02M 3/156 323/222 |

(Continued)

OTHER PUBLICATIONS

Yang Xue, et al., "Active Compensation of Current Unbalance in Paralleled Silicon Carbide MOSFETs" IEEE Applied Power Electronics Conference and Exposition, APEC, 2014, pp. 1471-1477.
(Continued)

*Primary Examiner* — Ryan Jager
(74) *Attorney, Agent, or Firm* — Oblon, McClelland, Maier & Neustadt, L.L.P.

(57) ABSTRACT

Aspects of the disclosure provide a power circuit that includes a first switch circuit in parallel with a second switch circuit. The first switch circuit and the second switch circuit are coupled to a first control node, a second control node, a first power node and a second power node via interconnections. The power circuit receives a control signal between the first control node and the second control node to control a current flowing from the first power node to the second power node through the first switch circuit and the second switch circuit. At least one of a first source terminal of the first switch circuit and a second source terminal of the second switch circuit is coupled to the second control node with a resistive element having a specific resistance.

19 Claims, 6 Drawing Sheets

(51) Int. Cl.
*H02M 7/537* (2006.01)
*H01L 29/16* (2006.01)

(58) Field of Classification Search
USPC .......................................................... 327/378
See application file for complete search history.

(56) References Cited

U.S. PATENT DOCUMENTS

| | | |
|---|---|---|
| 7,405,585 B2 | 7/2008 | Doong |
| 7,952,418 B2 | 5/2011 | McDonald et al. |
| 9,041,011 B2 | 5/2015 | Masood et al. |
| 9,190,907 B2 | 11/2015 | Philbrick et al. |
| 2012/0262220 A1 | 10/2012 | Springett |
| 2013/0001805 A1* | 1/2013 | Azuma ................. H01L 25/072 257/784 |
| 2016/0172844 A1 | 6/2016 | Van Dijk |
| 2016/0352327 A1* | 12/2016 | Wang ................. H03K 17/0822 |
| 2016/0352330 A1* | 12/2016 | Mao .................... H03K 17/687 |
| 2016/0352331 A1* | 12/2016 | Wang .................. H03K 17/687 |
| 2017/0302270 A1* | 10/2017 | Wang ........................ G05F 3/02 |
| 2018/0006644 A1* | 1/2018 | Mao ................... H03K 17/6871 |

OTHER PUBLICATIONS

U.S. Appl. No. 15/201,002, filed Sep. 1, 2016.

\* cited by examiner

METHOD AND APPARATUS FOR BALANCING CURRENT AND POWER

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

An electronic system may include switching devices in parallel to increase power capacity. The parallel switching devices may conduct different current due to, for example unbalanced layout and/or device parameter variations. Various techniques can be used to improve current and power balancing. In an example, switching devices are screened to select devices of similar characteristics in order to improve current balancing. In another example, active devices are added to balance current, such as disclosed by XUE et al. Active compensation of current unbalance in paralleled silicon carbide MOSFETs in IEEE Applied Power Electronics Conference and Exposition, APEC 2014 pp. 1471-1477.

SUMMARY

Aspects of the disclosure provide a power circuit that includes a first switch circuit in parallel with a second switch circuit. The first switch circuit and the second switch circuit are coupled to a first control node, a second control node, a first power node and a second power node via interconnections. The power circuit receives a control signal between the first control node and the second control node to control a current flowing from the first power node to the second power node through the first switch circuit and the second switch circuit. At least one of a first source terminal of the first switch circuit and a second source terminal of the second switch circuit is coupled to the second control node with a resistive element having a specific resistance.

According to an aspect of the disclosure, the specific resistance is determined based on process corners of the first switch circuit and the second switch circuit. In an embodiment, the at least one of the first source terminal of the first switch circuit and the second source terminal of the second switch circuit is coupled to the second control node via a resistor having the specific resistance. In another embodiment, the at least one of the first source terminal of the first switch circuit and the second source terminal of the second switch circuit is coupled to the second control node via an interconnection element having the specific resistance.

According to an aspect of the disclosure, the resistive element is configured to balance transient current flowing through the first switch circuit and the second switch circuit when the first and second switch circuits are switched on/off. Further, the resistive element is configured not to cause oscillation in the transient current flowing through the first switch circuit and the second switch circuit when the first and second switch circuits are switched on/off.

In an embodiment, the first switch circuit includes a first SiC metal-oxide-semiconductor field effect transistor and the second switch circuit includes a second SiC metal-oxide-semiconductor field effect transistor. In an example, the first switch circuit is on a first die and the second switch circuit is on a second die, and the first die and the second die are assembled in a package.

Aspects of the disclosure provide an apparatus that includes the power circuit.

Aspects of the disclosure also provide a method for designing the power circuit. The method includes determining process corners of variation sources for manufacturing the power circuit. Then, the method includes determining the specific resistance for the resistive element based on the process corners.

BRIEF DESCRIPTION OF THE DRAWINGS

Various embodiments of this disclosure that are proposed as examples will be described in detail with reference to the following figures, wherein like numerals reference like elements, and wherein.

DETAILED DESCRIPTION OF EMBODIMENTS

Figure 1:
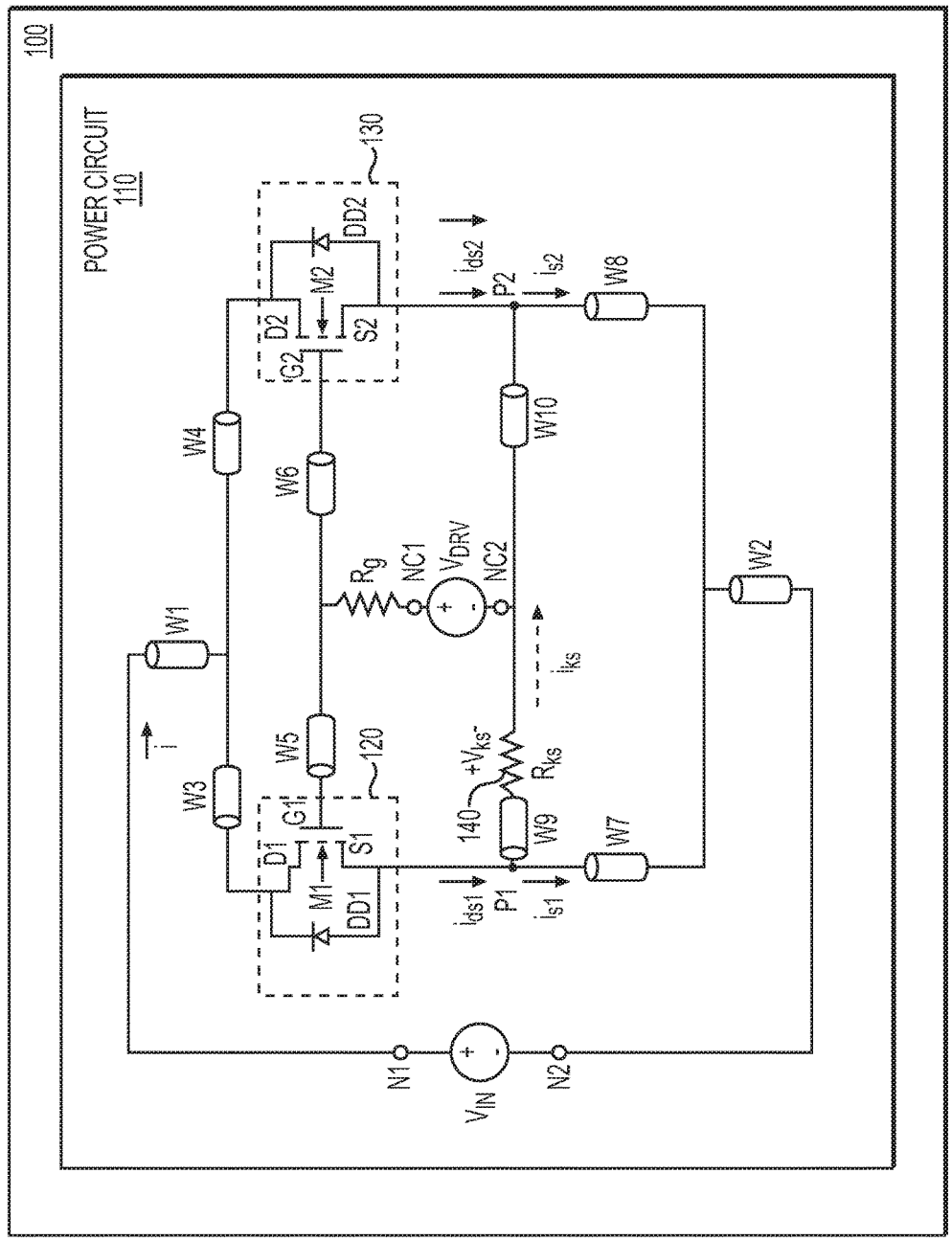
FIG. 1 shows a diagram of a system 100 according to an embodiment of the disclosure.

FIG. 1 shows a diagram of a system 100 according to an embodiment of the disclosure. The system 100 includes a power circuit 110 that uses a passive element, such as a resistive element, and the like to balance current and/or power in parallel components.

The system 100 can be any suitable system that requires a relatively large power, such as a hybrid vehicle, an electric vehicle, a wind energy system, a printing system, and the like. During operation, in an example, the power circuit 110 needs to provide a relatively large current, such as in the order of Ampere, in the order of tens of Amperes, in the order of hundreds of Amperes, more than hundreds of Amperes, and the like. In an embodiment, the power circuit 110 is configured to use parallel components to share the relatively large current load. It is noted that, in an example, the system 100 can include multiple power circuits coupled together, and the multiple power circuits can be similarly configured as the power circuit 110.

In an embodiment, the power circuit 110 is a part of a power converter circuit, such as a DC-to-AC inverter, an AC-to-DC rectifier, and the like, and is implemented using semiconductor switching devices. The semiconductor switching devices form a plurality of switchable current paths to share the current load. According to an aspect of the disclosure, the semiconductor switching devices may have wide parameter variations, such as threshold voltage (Vth) variations, on-resistance Rds(on) variations, and the like due to manufacturing process. Additionally, interconnections that couple the switching devices may be asymmetric due to layout limitations. The parameter variations and the asymmetric layout can cause unbalanced current/power on the plurality of switchable current paths. According to an aspect of the disclosure, one or more resistive elements are used to improve current/power balance among the plurality of switchable current paths.

In the FIG. 1 example, the power circuit 110 has two control nodes NC1 and NC2, and two power nodes N1 and N2. Further, the power circuit 110 includes a plurality of switch modules, such as a first switch module 120, a second switch module 130 and the like that. The switch modules are coupled in parallel to the control nodes and the power nodes using interconnection components, such as wirebonds, busbars and the like. The switch modules are configured to switch on/off current paths between the first power node N1 and the second power node N2 based on control signals received at the control nodes NC1 and NC2. In an example, a driving voltage $V_{DRV}$ is applied between the control nodes NC1 and NC2 to drive a current i that flows through from one power node to the other power node.

Each switch module can include one or more transistors. When multiple transistors are used in a switch module, the multiple transistors can be arranged in various topologies to act as a switch.

Specifically, in the FIG. 1 example, the first switch module 120 includes a first transistor M1, and the second switch module 130 includes a second transistor M2. The first transistor M1 and the second transistor M2 can be any suitable transistors, such as metal-oxide-semiconductor field effect transistors (MOSFET) and the like. In an example, the first transistor M1 and the second transistor M2 are SiC MOSFET transistors that may have relatively wide parameter variations due to manufacturing process.

Further, in the FIG. 1 example, the first transistor M1 has a gate terminal G1, a source terminal S1 and a drain terminal D1 and the second transistor Q2 has a gate terminal G2, a source terminal S2 and a drain terminal D2. Further, in the example, the terminals are suitably coupled to the power nodes and the control nodes by interconnection components. For example, the gate terminals G1 and G2 are coupled to the first control node NC1 via interconnection components, such as shown by W5 and W6, the drain terminals D1 and D2 are coupled to the first power node N1 via interconnection components, such as shown by W1, W3 and W4, the source terminals S1 and S2 are coupled to the second power node N2 via interconnection components, such as shown by W7, W8 and W2, and the source terminals S1 and S2 are coupled to the second control node NC2 via interconnection components such as shown by W9 and W10.

According to the disclosure, transistor parameter variations and layout asymmetry can cause unbalance in current and power. In an example, the first transistor M1 and the second transistor M2 have threshold voltage difference. For example, the first transistor M1 has a smaller threshold voltage than the second transistor M2. Thus, when the two transistors are turned on in parallel, for example when the same gate-source voltage and drain-source voltage are applied to the first transistor M1 and the second transistor M2, the first transistor M1 turns on stronger than the second transistor M2, and the first transistor M1 can conduct a higher drain-source transient current than the second transistor M2.

According to an aspect of the disclosure, additional resistance is purposely introduced between at least one of the source terminals S1 and S2 to the second control node NC2 to improve current and/or power balance. In an example, the interconnection components from the source terminals to the second control node NC2 and the interconnection components from the source terminals to the second power node N2 are preferred to separate at positions as close as possible to the source terminals. For example, the interconnection components W9 and W10 are respectively separate (split) from the interconnection components W7 and W8 at positions P1 and P2. In the example, the positions P1 and P2 are referred to as Kelvin sources, and are preferred to be as close as possible to the source terminals S1 and S2, thus the parasitic resistance of the interconnections (not shown) from the source terminals to the Kelvin sources is very small compared to the other interconnections (e.g., W7, W8, etc.), and is ignorable.

Further, according to an aspect of the disclosure, the resistive characteristic from the Kelvin sources P1 and P2 to the second control node NC2 are suitably designed to improve transient current and/or power balance of the parallel switch modules 120 and 130. In the FIG. 1 example, a Kelvin source resistor $R_{KS}$ is used to accumulatively model the resistive characteristic, for example including the resistance of the interconnection components W9 and W10, additional resistance inserted between the Kelvin sources and the second control node NC2, and the like. In the FIG. 1 example, the Kelvin source resistor $R_{KS}$ is disposed between the Kelvin source P1 and the second control node NC2.

In the FIG. 1 example, the Kelvin resistor $R_{KS}$ improves transient current/power balance among the switch modules. In an example that the first transistor M1 has a smaller threshold voltage than the second transistor M2, at a time to switch on the first transistor M1 and the second transistor M2, a first current $i_{ds1}$ flowing through the first transistor M1 increases faster and is larger than a second current $i_{ds2}$ flowing through the second transistor M2. In an example, the interconnection components W7 and W8 are balanced, thus there exists a voltage difference between the two Kelvin sources P1 and P2, and thus a positive Kelvin source current $i_{KS}$ flows through the Kelvin source resistor $R_{KS}$ from the Kelvin source P1 to the Kelvin source P2 for example. The positive Kelvin source current $i_{KS}$ then causes a positive voltage drop $V_{KS}$ on the Kelvin source resistor $R_{KS}$. The positive voltage drop $V_{KS}$ on the Kelvin source resistor $R_{KS}$ then causes a smaller gate source voltage to be applied on the first transistor M1 than the second transistor M2. The gate-source voltage difference applied on the two transistors can counteract the threshold difference of the two transistors, and balance the transient current flowing through the two transistors.

When the first transistor M1 has a larger threshold voltage than the second transistor M2, at a time to switch on the first transistor M1 and the second transistor M2, a first current $i_{ds1}$ flowing through the first transistor M1 increases slower and is smaller than a second current flowing through the second transistor M2. In an example, the interconnection components W7 and W8 are balanced, thus there exists a voltage difference between the two Kelvin sources P1 and P2, and thus a negative Kelvin source current $i_{KS}$ flows through the Kelvin source resistor $R_{KS}$ from the Kelvin source P1 to the Kelvin source P2 for example. The negative Kelvin source current $i_{KS}$ then causes a negative voltage drop $V_{KS}$ on the Kelvin source resistor $R_{KS}$. The negative voltage drop $V_{KS}$ on the Kelvin source resistor $R_{KS}$ then causes a larger gate source voltage to be applied on the first transistor M1 than the second transistor M2. The gate-source voltage difference applied on the two transistors can counteract the threshold difference of the two transistors, and balance the transient current flowing through the two transistors.

Similarly, at a time to switch off the first transistor M1 and the second transistor M2, the transient current flowing through the first transistor M1 and the second transistor M2 is balanced due to the Kelvin source resistor $R_{KS}$.

It is noted that, in an embodiment, the resistance of the Kelvin source resistor $R_{KS}$ is suitably determined not to cause oscillation during switching. In an example, initially when the first transistor M1 and the second transistor M2 are switched on, the first current $i_{ds1}$ flowing through the first transistor M1 is larger than the second current $i_{ds2}$ flowing through the second transistor M2 due to the lower threshold of the first transistor M1. When the Kelvin source resistance is too large, the voltage drop on the Kelvin source resistance can be too large that cause the first current $i_{ds1}$ to quickly drop (undershoot) below the second current $i_{ds2}$. Then, the current flowing through the Kelvin source resistance can change direction, and then can cause the first current $i_{ds1}$ to quickly increase (overshoot) above the second current $i_{ds2}$. The first current $i_{ds1}$ can repetitively undershoot below the second current $i_{ds2}$ and overshoot above the second current $i_{ds2}$ due to the relative large Kelvin source resistance during the switching. The repetitive undershoot and overshoot can be referred to as oscillation.

According to an aspect of the disclosure, the additional Kelvin source resistance can be implemented using any suitable technique. In an example, the interconnection component W9 is made thinner to introduce the Kelvin source resistance. In another example, a discrete resistor with the desired resistance is added between the Kelvin source P1 and the second control node NC2.

It is noted that the power circuit 110 can be implemented by various technology. In an example, switch modules, such as the first switch module 120, the second switch module 130, and the like, are implemented as bare dies, and the interconnection modules are implemented as wirebonds and/or busbars. The switch modules, the interconnection modules and other suitable components are assembled in a package to form the power circuit 110. In another example, the switch modules are discrete devices that are assembled in separate packages, and the switch modules are interconnected by wirebonds and busbars. In another example, the switch modules are integrated on an integrated circuit (IC) chip, and the interconnection modules are implemented as wires on the IC chip using IC manufacturing technology.

Figure 2:
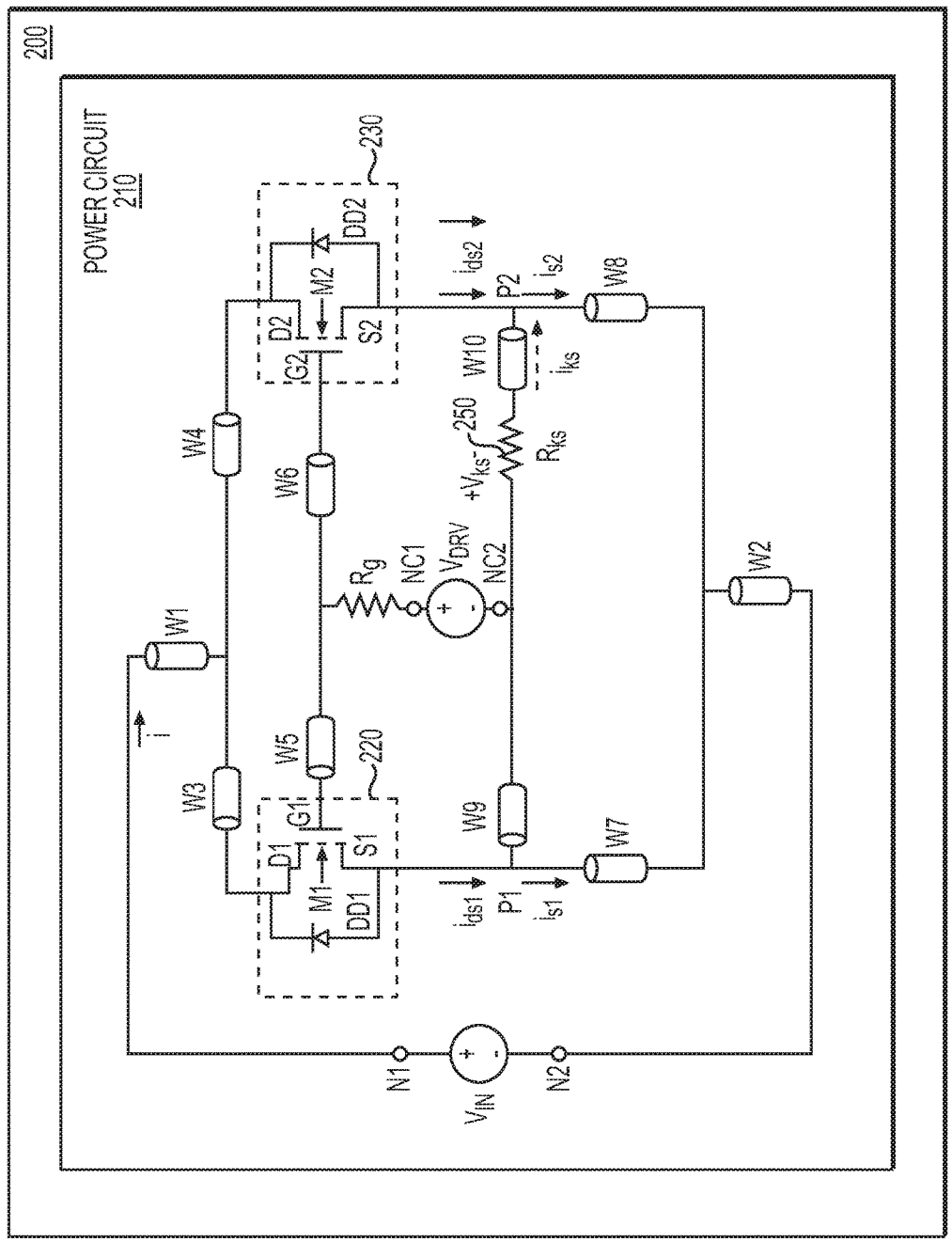
FIG. 2 shows a diagram of a system 200 according to an embodiment of the disclosure.

According to an aspect of the disclosure, the Kelvin source resistance can be introduced between the Kelvin source P1 and the Kelvin source P2 at various locations. In the FIG. 1 example, the Kelvin source resistance is introduced between the Kelvin source P1 and the second control node NC2. In another example, the Kevin source resistance can be introduced between the Kelvin source P2 and the second control node NC2 as shown in FIG. 2. In another example, the Kelvin source resistance can be introduced at both locations between the Kelvin source P1 and the second control node NC2 and between the Kelvin source P2 and the second control node NC2.

FIG. 2 shows a diagram of a system 200 according to an embodiment of the disclosure. The system 200 operates similarly to the system 100 described above. The system 200 also utilizes certain components that are identical or equivalent to those used in the system 100; the description of these components has been provided above and will be omitted here for clarity purposes. In the FIG. 2 example, the Kelvin source resistance is introduced between the Kelvin source P2 and the second control node NC2.

In the FIG. 2 example, the Kelvin resistor $R_{KS}$ improves transient current/power balance among the switch modules. In an example that the first transistor M1 has a smaller threshold voltage than the second transistor M2, at a time to switch on the first transistor M1 and the second transistor M2, a first current $i_{ds1}$ flowing through the first transistor M1 increases faster and is larger than a second current $i_{ds2}$ flowing through the second transistor M2. In an example, the interconnection components W7 and W8 are balanced, thus there exists a voltage difference between the two Kelvin sources P1 and P2, and thus a positive Kelvin source current $i_{KS}$ flows through the Kelvin source resistor $R_{KS}$ from the Kelvin source P1 to the Kelvin source P2 for example. The positive Kelvin source current $i_{KS}$ then causes a positive voltage drop $V_{KS}$ on the Kelvin source resistor $R_{KS}$. The positive voltage drop $V_{KS}$ on the Kelvin source resistor $R_{KS}$ then causes a larger gate source voltage to be applied on the second transistor M2 than the first transistor M1. The gate-source voltage difference applied on the two transistors can counteract the threshold difference of the two transistors, and balance the transient current flowing through the two transistors.

When the first transistor M1 has a larger threshold voltage than the second transistor M2, at a time to switch on the first transistor M1 and the second transistor M2, a first current $i_{ds1}$ flowing through the first transistor M1 increases slower and is smaller than a second current $i_{ds2}$ flowing through the second transistor M2. In an example, the interconnection components W7 and W8 are balanced, thus there exists a voltage difference between the two Kelvin sources P1 and P2, and thus a negative Kelvin source current $i_{KS}$ flows through the Kelvin source resistor $R_{KS}$ from the Kelvin source P1 to the Kelvin source P2 for example. The negative Kelvin source current $i_{KS}$ then causes a negative voltage drop $V_{KS}$ on the Kelvin source resistor $R_{KS}$. The negative voltage drop $V_{KS}$ on the Kelvin source resistor $R_{KS}$ then causes a smaller gate source voltage to be applied on the second transistor M2 than the first transistor M1. The gate-source voltage difference applied on the two transistors can counteract the threshold difference of the two transistors, and balance the transient current flowing through the two transistors.

Figure 3:
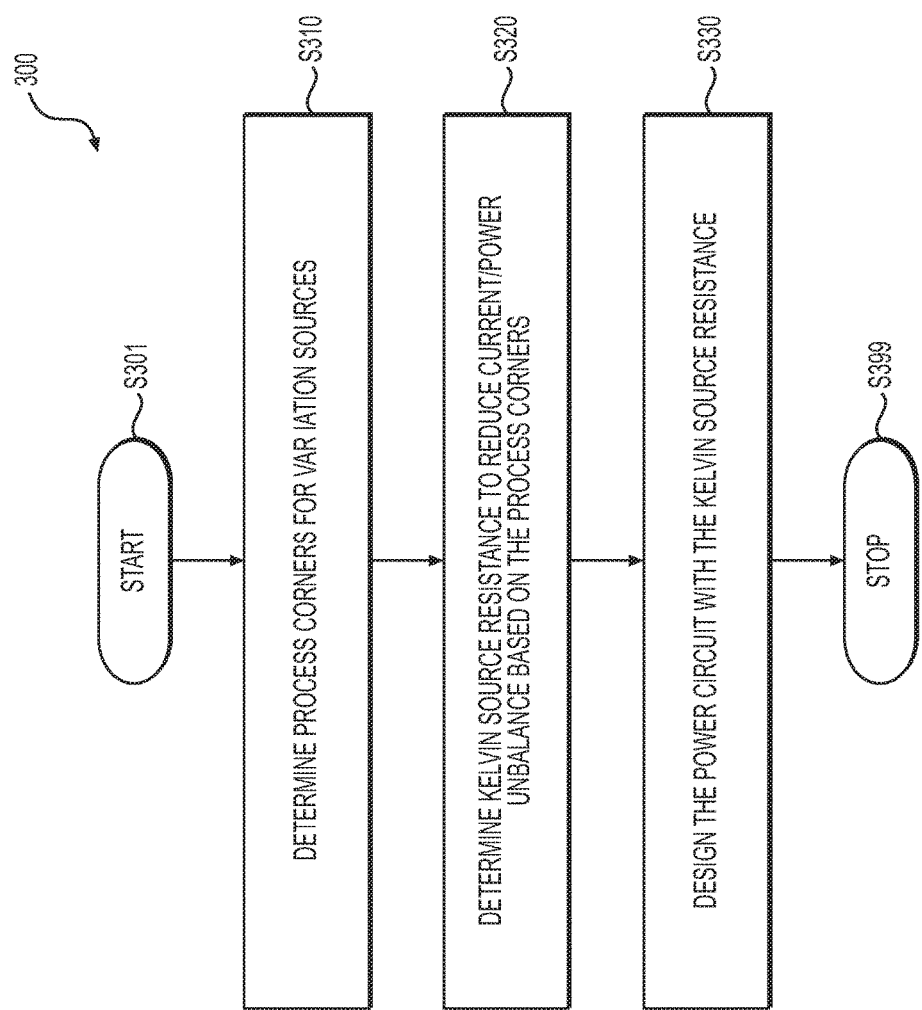
FIG. 3 shows a flow chart outlining a process 300 according to an embodiment of the disclosure.

FIG. 3 shows a flow chart outlining a process 300 according to an embodiment of the disclosure. In an example, the process 300 is executed during design and manufacture of a power circuit, such as the power circuit 110, the power circuit 210, and the like. The process starts at S301, and proceeds to S310.

At S310, process corners are determined. In an embodiment, variation sources are identified, and the variation sources are characterized to determine the process corners. For example, when threshold voltage is identified as a variation source, the manufacturing process for the SiC MOSFET transistors is characterized to determine the largest threshold voltage and the smallest threshold voltage of the acceptable range for example.

At S320, the Kelvin source resistance is determined based on the process corners. In an embodiment, the Kelvin source resistance is determined to reduce the transient current/power unbalance and not to cause oscillation. In an example, the Kelvin source resistance is inversely proportional to the threshold voltage difference of the process corners.

At S330, the power circuit with the Kelvin source resistance is designed. In an embodiment, the interconnection component W9 is suitably designed to have specific width, length to introduce the Kelvin source resistance. In another embodiment, one or more discrete resistors are selected to provide the Kelvin source resistance. Then, the power circuit is manufactured according to the design. The process proceeds to S399 and terminates.

Figure 4:
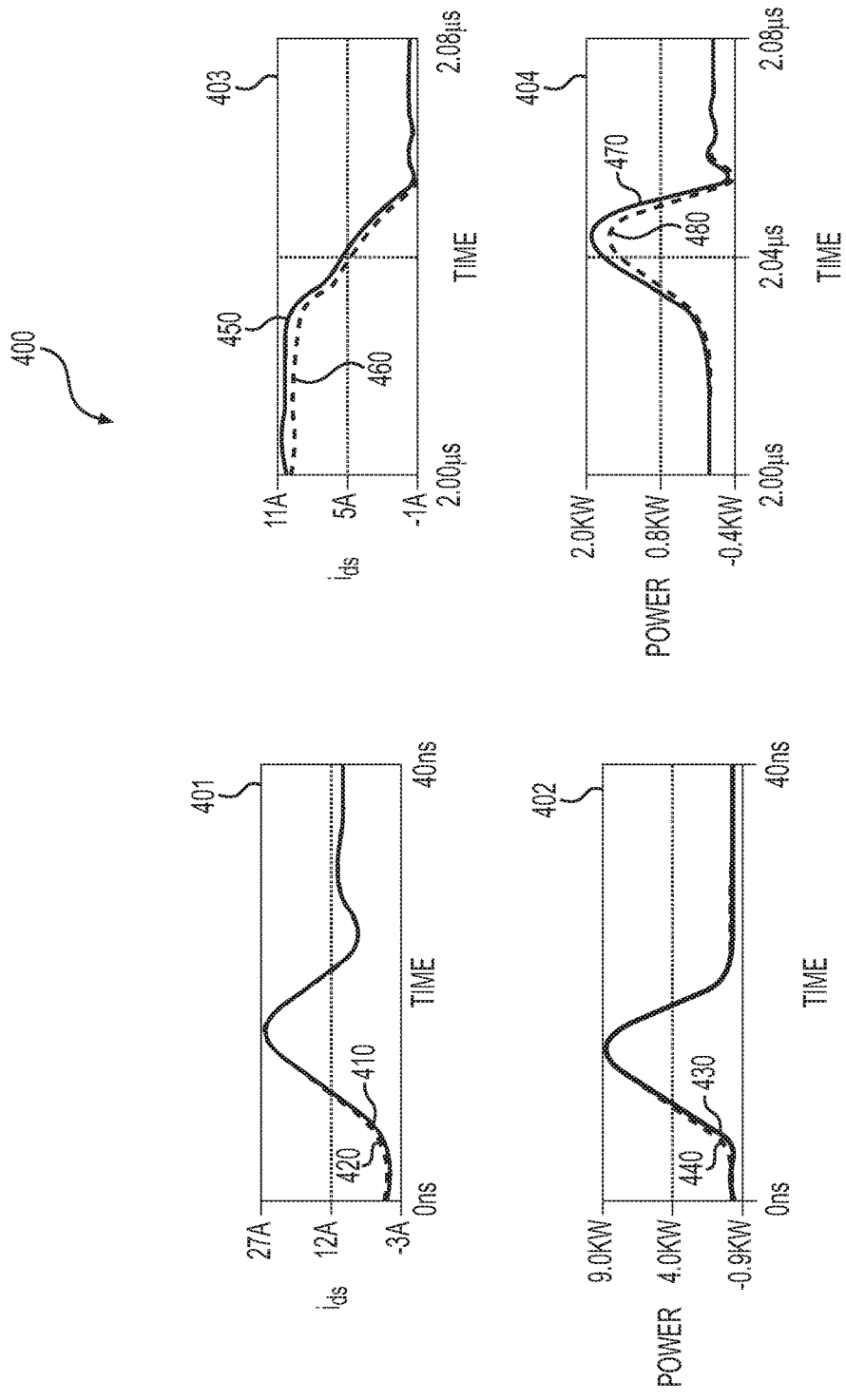
FIGS. 4-6 show plots of simulation results according to an embodiment of the disclosure.
Figure 5:
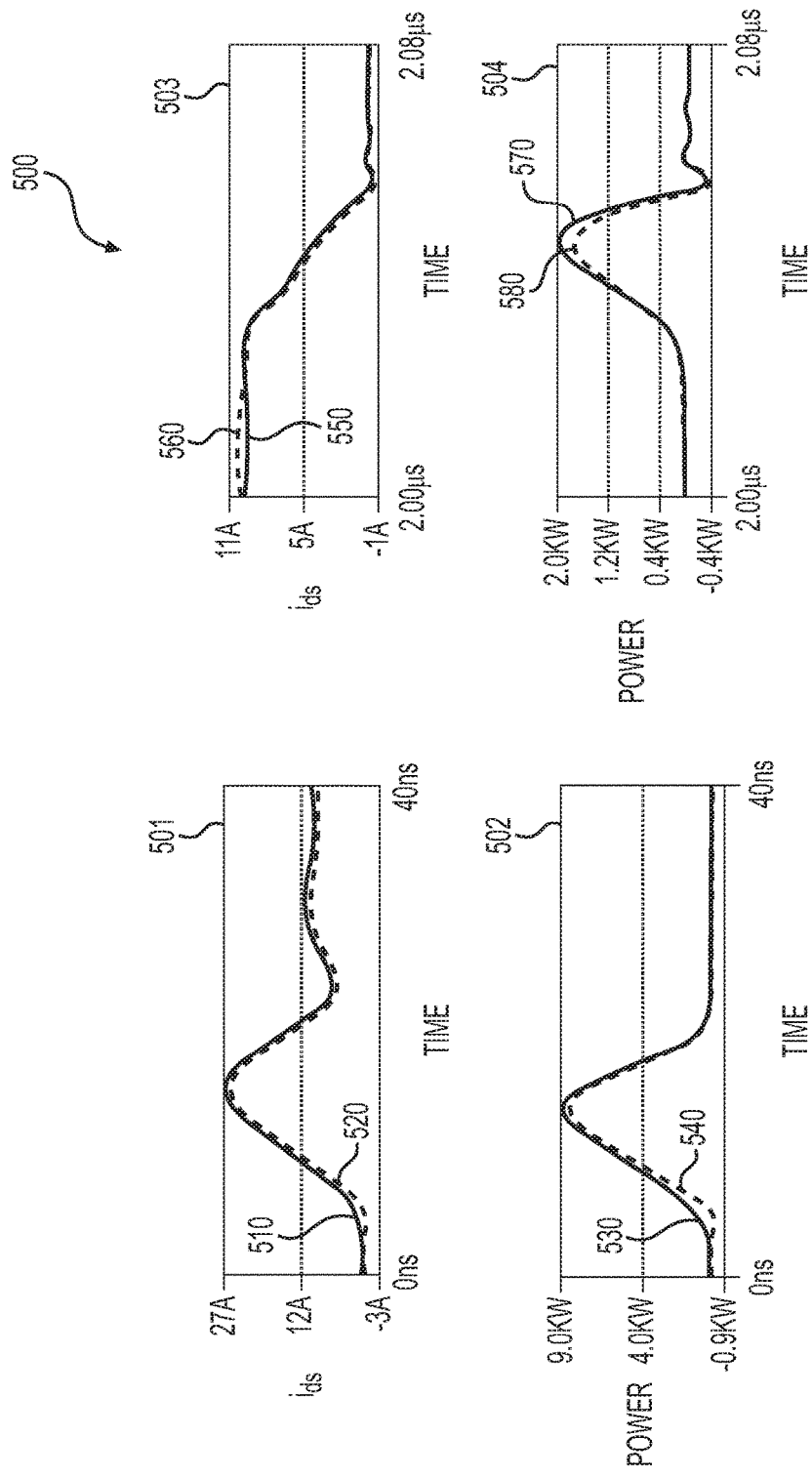
Figure 6:
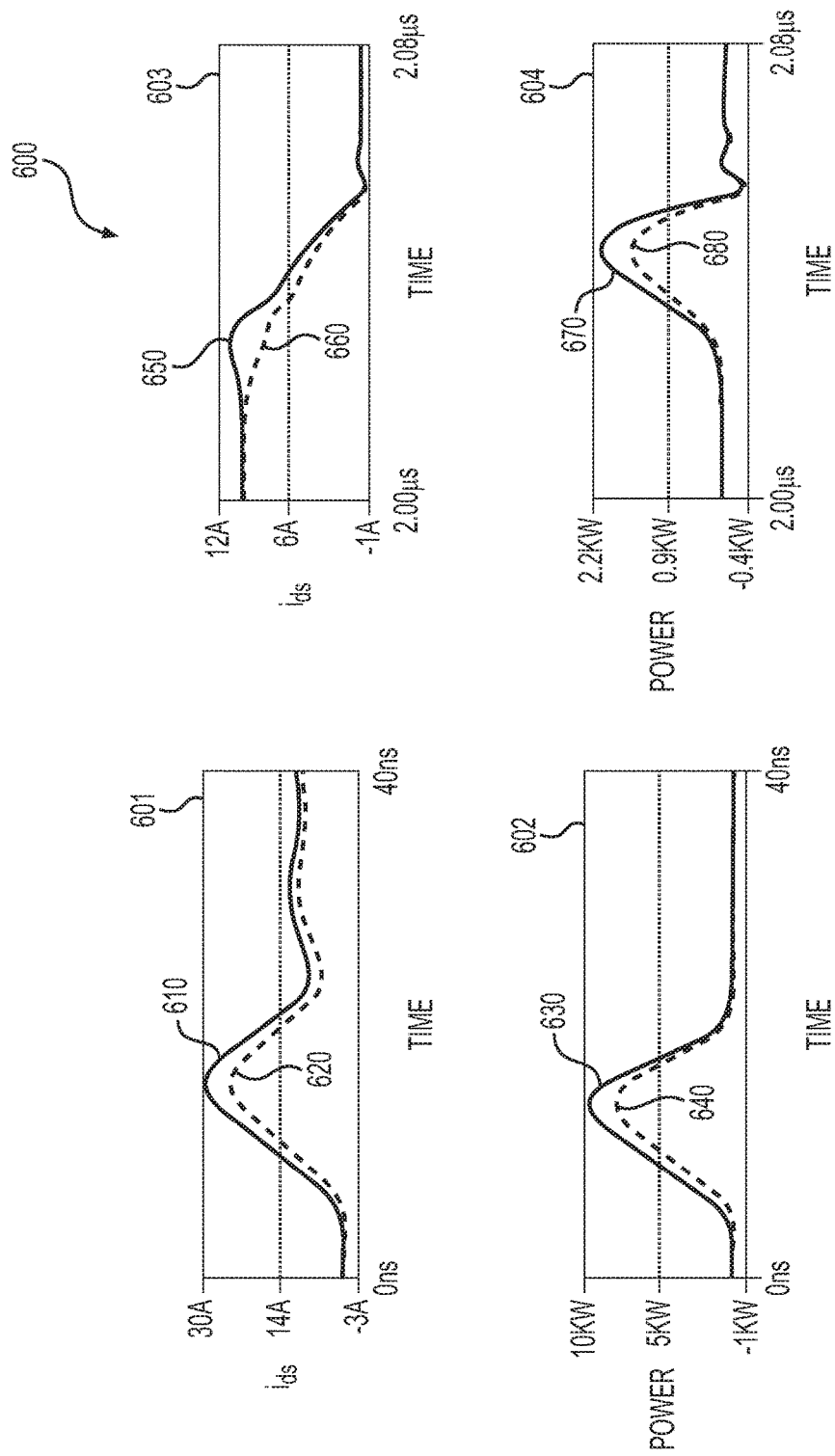

FIGS. 4-6 show plots of simulation results according to an embodiment of the disclosure. FIG. 4 shows plots 401-404 of simulation results for the power circuit 110 with the Kelvin source resistor $R_{KS}$ disposed between the Kelvin source P1 and the second control node NC2. The plots 401-404 show transient current and power loss changing with time during switching on and switching off of the power circuit 110. In the simulation, the first transistor M1 has a smaller threshold voltage than the second transistor M2. For example, the first transistor M1 has 2.2V threshold voltage, and the second transistor M2 has 3V threshold voltage.

In the FIG. 4 example, the plot 401 shows transient current changing with time during switching on of the power circuit 110, the plot 402 shows power loss changing with time during switching on of the power circuit 110, the plot 403 shows transient current changing with time during switching off of the power circuit 110, and the plot 404 shows power loss changing with time during switching off of the power circuit 110.

In the plot 401, the X-axis denotes time, and the Y-axis denotes transient current. The plot 401 includes a curve 410 that shows the source-drain transient current $i_{ds1}$ of the first transistor M1, and a curve 420 that shows the source-drain transient current $i_{ds2}$ of the second transistor M2 during switching on of the power circuit 110.

In the plot 402, the X-axis denotes time, and the Y-axis denotes power. The plot 402 includes a curve 430 that shows the power loss by the first transistor M1, and a curve 420 that shows the power loss by the second transistor M2 during switching on of the power circuit 110.

In the plot 403, the X-axis denotes time, and the Y-axis denotes transient current. The plot 403 includes a curve 450 that shows the source-drain current $i_{ds1}$ of the first transistor M1, and a curve 460 that shows the source-drain current $i_{ds2}$ of the second transistor M2 during switching off of the power circuit 110.

In the plot 404, the X-axis denotes time, and the Y-axis denotes power. The plot 404 includes a curve 470 that shows the power loss by the first transistor M1, and a curve 480 that shows the power loss by the second transistor M2 during switching off of the power circuit 110.

FIG. 5 shows plots 501-504 of simulation results for the power circuit 210 with the Kelvin source resistor $R_{KS}$ disposed between the Kelvin source P2 and the second control node NC2. The plots 501-504 show transient current and power loss changing with time during switching on and switching off of the power circuit 210. In the simulation, the first transistor M1 has a smaller threshold voltage than the second transistor M2. For example, the first transistor M1 has 2.2V threshold voltage, and the second transistor M2 has 3V threshold voltage.

In the FIG. 5 example, the plot 501 shows transient current changing with time during switching on of the power circuit 210, the plot 502 shows power loss changing with time during switching on of the power circuit 210, the plot 503 shows transient current changing with time during switching off of the power circuit 210, and the plot 504 shows power loss changing with time during switching off of the power circuit 210.

In the plot 501, the X-axis denotes time, and the Y-axis denotes transient current. The plot 501 includes a curve 510 that shows the source-drain transient current $i_{ds1}$ of the first transistor M1, and a curve 520 that shows the source-drain transient current $i_{ds2}$ of the second transistor M2 during switching on of the power circuit 210.

In the plot 502, the X-axis denotes time, and the Y-axis denotes power. The plot 502 includes a curve 530 that shows the power loss by the first transistor M1, and a curve 520 that shows the power loss by the second transistor M2 during switching on of the power circuit 210.

In the plot 503, the X-axis denotes time, and the Y-axis denotes transient current. The plot 503 includes a curve 550 that shows the source-drain transient current $i_{ds1}$ of the first transistor M1, and a curve 560 that shows the source-drain transient current $i_{ds2}$ of the second transistor M2 during switching off of the power circuit 210.

In the plot 504, the X-axis denotes time, and the Y-axis denotes power. The plot 504 includes a curve 570 that shows the power loss by the first transistor M1, and a curve 580 that shows the power loss by the second transistor M2 during switching off of the power circuit 210.

FIG. 6 shows simulation results for a related power circuit without additional Kelvin source resistor compared to the power circuit 110 and the power circuit 210. The plots 601-604 show transient current and power loss changing with time during switching on and switching off of the related power circuit. In the simulation, the first transistor M1 has a smaller threshold voltage than the second transistor M2. For example, the first transistor M1 has 2.2V threshold voltage, and the second transistor M2 has 3V threshold voltage in the related power circuit.

In the FIG. 6 example, the plot 601 shows transient current changing with time during switching on of the related power circuit, the plot 602 shows power loss changing with time during switching on of the related power circuit, the plot 603 shows transient current changing with time during switching off of the related power circuit, and the plot 604 shows power loss changing with time during switching off of the related power circuit.

In the plot 601, the X-axis denotes time, and the Y-axis denotes transient current. The plot 601 includes a curve 610 that shows the source-drain transient current $i_{ds1}$ of the first transistor M1, and a curve 620 that shows the source-drain transient current $i_{ds2}$ of the second transistor M2 during switching on of the related power circuit.

In the plot 602, the X-axis denotes time, and the Y-axis denotes power. The plot 602 includes a curve 630 that shows the power loss by the first transistor M1, and a curve 620 that shows the power loss by the second transistor M2 during switching on of the related power circuit.

In the plot 603, the X-axis denotes time, and the Y-axis denotes transient current. The plot 603 includes a curve 650 that shows the source-drain transient current $i_{ds1}$ of the first transistor M1, and a curve 660 that shows the source-drain transient current $i_{ds2}$ of the second transistor M2 during switching off of the related power circuit.

In the plot 604, the X-axis denotes time, and the Y-axis denotes power. The plot 604 includes a curve 670 that shows the power loss by the first transistor M1, and a curve 680 that shows the power loss by the second transistor M2 during switching off of the related power circuit.

In the related power circuit, due to the threshold difference between the first transistor M1 and the second transistor M2, the source-drain transient current $i_{ds1}$ of the first transistor M1 is significantly different from the source-drain transient current $i_{ds2}$ of the second transistor M2 during switching on and switching off. In a simulation example, the power loss difference between the first transistor M1 and the second transistor M2 in the related power circuit is 25% during switching on and 30% during switching off.

The power circuit 110 and the power circuit 210 significantly improve transient current and power balance. For example, the power loss difference between the first transistor M1 and the second transistor M2 in the power circuit 110 is 3.1% during switching on and 19.2% during switching off, and the power loss difference between the first transistor M1 and the second transistor M2 in the power circuit 210 is 10.6% during switching on and 9.1% during switching off.

While aspects of the present disclosure have been described in conjunction with the specific embodiments thereof that are proposed as examples, alternatives, modifications, and variations to the examples may be made. Accordingly, embodiments as set forth herein are intended to be illustrative and not limiting. There are changes that may be made without departing from the scope of the claims set forth below.

What is claimed is:

1. A power circuit, comprising:
a first switch circuit in parallel with a second switch circuit, the first switch circuit and the second switch circuit being coupled to a first control node, a second control node, a first power node and a second power node via interconnections, the power circuit receiving a control signal between the first control node and the second control node to control a current flowing from the first power node to the second power node through the first switch circuit and the second switch circuit, wherein at least one of a first source terminal of the first switch circuit and a second source terminal of the second switch circuit is coupled to the second control node with a resistive element having a specific resistance, the second control node and the second power node being separated by one or more interconnection components.

2. The power circuit of claim 1, wherein the specific resistance is determined based on process corners of the first switch circuit and the second switch circuit.

3. The power circuit of claim 1, wherein the at least one of the first source terminal of the first switch circuit and the second source terminal of the second switch circuit is coupled to the second control node via a resistor having the specific resistance.

4. The power circuit of claim 1, wherein the at least one of the first source terminal of the first switch circuit and the second source terminal of the second switch circuit is coupled to the second control node via a Kelvin source resistor having the specific resistance.

5. The power circuit of claim 1, wherein the resistive element is configured to balance transient current flowing through the first switch circuit and the second switch circuit when the first and second switch circuits are switched on/off.

6. The power circuit of claim 5, wherein the resistive element is configured not to cause oscillation in the transient current flowing through the first switch circuit and the second switch circuit when the first and second switch circuits are switched on/off.

7. The power circuit of claim 1, wherein the first switch circuit includes a first SiC metal-oxide-semiconductor field effect transistor and the second switch circuit includes a second SiC metal-oxide-semiconductor field effect transistor.

8. The power circuit of claim 1, wherein the first switch circuit is on a first die and the second switch circuit is on a second die.

9. The power circuit of claim 8, wherein the first die and the second die are assembled in a package.

10. An apparatus, comprising:
a power circuit having a first switch circuit in parallel with a second switch circuit, the first switch circuit and the second switch circuit being coupled to a first control node, a second control node, a first power node and a second power node via interconnections, the power circuit receiving a control signal between the first control node and the second control node to control a current flowing from the first power node to the second power node through the first switch circuit and the second switch circuit, wherein at least one of a first source terminal of the first switch circuit and a second source terminal of the second switch circuit is coupled to the second control node with a resistive element having a specific resistance, the second control node and the second power node being separated by one or more interconnection components.

11. The apparatus of claim 10, wherein the specific resistance is determined based on process corners of the first switch circuit and the second switch circuit.

12. The apparatus of claim 10, wherein the at least one of the first source terminal of the first switch circuit and the second source terminal of the second switch circuit is coupled to the second control node via a resistor having the specific resistance.

13. The apparatus of claim 10, wherein the at least one of the first source terminal of the first switch circuit and the second source terminal of the second switch circuit is coupled to the second control node via a Kelvin source resistor having the specific resistance.

14. The apparatus of claim 10, wherein the resistive element is configured to balance transient current flowing through the first switch circuit and the second switch circuit when the first and second switch circuits are switched on/off.

15. The apparatus of claim 14, wherein the resistive element is configured not to cause oscillation in the transient current flowing through the first switch circuit and the second switch circuit when the first and second switch circuits are switched on/off.

16. The apparatus of claim 10, wherein the first switch circuit includes a first SiC metal-oxide-semiconductor field effect transistor and the second switch circuit includes a second SiC metal-oxide-semiconductor field effect transistor.

17. The apparatus of claim 10, wherein the first switch circuit is on a first die and the second switch circuit is on a second die.

18. The apparatus of claim 17, wherein the first die and the second die are assembled in a package.

19. A method, comprising:
determining process corners of variation sources for manufacturing a power circuit having a first switch circuit in parallel with a second switch circuit, the first switch circuit and the second switch circuit being coupled to a first control node, a second control node, a first power node and a second power node via interconnections, the power circuit receiving a control signal between the first control node and the second control node to control a current flowing from the first power node to the second power node through the first switch circuit and the second switch circuit; and
determining a specific resistance for a resistive element based on the process corners, the resistive element being disposed between at least one of a first source terminal of the first switch circuit and a second source terminal of the second switch circuit to the second control node, and the second control node and the second power node being separated by one or more interconnection components.

* * * * *